(12) United States Patent
Cusack et al.

(10) Patent No.: US 7,745,263 B2
(45) Date of Patent: Jun. 29, 2010

(54) SYSTEM AND METHOD FOR ROUTING SUPPLY VOLTAGES OR OTHER SIGNALS BETWEEN SIDE-BY-SIDE DIE AND A LEAD FRAME FOR SYSTEM IN A PACKAGE (SIP) DEVICES

(75) Inventors: Michael D. Cusack, Bend, ID (US);
Randall D. Briggs, Boise, ID (US)

(73) Assignee: Marvell International Technology Ltd., Hamilton (BM)

( * ) Notice: Subject to any disclaimer, the term of this patent is extended or adjusted under 35 U.S.C. 154(b) by 0 days.

(21) Appl. No.: 12/237,266

(22) Filed: Sep. 24, 2008

(65) Prior Publication Data

US 2009/0020857 A1 Jan. 22, 2009

Related U.S. Application Data

(62) Division of application No. 11/352,167, filed on Feb. 10, 2006, now Pat. No. 7,443,011.

(51) Int. Cl.
*H01L 21/00* (2006.01)
(52) U.S. Cl. .................. 438/123; 257/678; 257/690

(58) Field of Classification Search .............. None
See application file for complete search history.

(56) References Cited

U.S. PATENT DOCUMENTS

| | | | |
|---|---|---|---|
| 5,325,268 | A | 6/1994 | Nachnani et al. |
| 5,552,966 | A | 9/1996 | Nagano |
| 5,625,235 | A | 4/1997 | Takiar |
| 7,148,567 | B2 | 12/2006 | Moriguchi et al. |
| 2002/0123186 | A1* | 9/2002 | Mayama et al. ............. 438/200 |
| 2005/0156305 | A1* | 7/2005 | Moriguchi et al. .......... 257/690 |
| 2007/0128821 | A1* | 6/2007 | Lee et al. .................... 438/381 |

* cited by examiner

*Primary Examiner*—Ha Tran T Nguyen
*Assistant Examiner*—Shantanu C Pathak

(57) ABSTRACT

An integrated circuit or chip includes a first die and a second die positioned on a lead frame of a package including a lead frame, such as a QFP, DIP, PLCC, TSOP, or any other type of package including a lead frame. The integrated circuit further includes a redistribution layer formed on the first die to couple selected bond fingers of the lead frame to selected bonding pads of the first and second die. The selected bond fingers may correspond to bond fingers that receive a first supply voltage or the first supply voltage and a second supply voltage.

13 Claims, 5 Drawing Sheets

SYSTEM AND METHOD FOR ROUTING SUPPLY VOLTAGES OR OTHER SIGNALS BETWEEN SIDE-BY-SIDE DIE AND A LEAD FRAME FOR SYSTEM IN A PACKAGE (SIP) DEVICES

CROSS-REFERENCES TO RELATED APPLICATIONS

The present application is a divisional of U.S. patent application Ser. No. 11/352,167, entitled "SYSTEM AND METHOD FOR ROUTING SUPPLY VOLTAGES OR OTHER SIGNALS BETWEEN SIDE-BY-SIDE DIE AND A LEAD FRAME FOR SYSTEM IN A PACKAGE (SIP) DEVICES." The specification of said application is hereby incorporated in its entirety for all purposes, except for those sections, if any, that are inconsistent with this specification.

Integrated circuits or electronic chips are ubiquitous, being contained in many electronic devices used by a person during a typical day, such as in cellular telephones, personal computers, automobiles, and even common household appliances like toasters. A chip includes a semiconductor die, which is made of semiconductor material such as silicon, and in which desired electronic circuitry is formed. For example, a memory chip is a chip containing a die in which electronic circuitry is formed for storing and retrieving data. A chip also includes a package that houses the die and includes pins that provide for electrical interconnection of the chip to external electronic components. Various different types of packages are utilized for chips, with the specific type of package being determined by numerous factors such as required heat dissipation, the physical size of the chip, and the number of interconnections needed from the die to external electronic components. Common packages for chips include single in-line packages (SIPs), dual in-line packages (DIPs), plastic leaded chip carriers (PLCC), Thin Small Outline Packages (TSOPs), pin-grid arrays (PGAs), ball-grid arrays (BGAs), and quad flat packs (QFPs).

In some situations, more than one die is housed in a given package to form what is commonly referred to as a "system in a package" (SIP) device or simply an SIP. The two or more die in this situation must be electrically interconnected, and depending on the type of package this interconnection may present difficulties. These difficulties often occur when using any type of package including a lead frame, such as the DIP, PLCC, TSOP, and QFP packages previously mentioned. For example, a quad-flat pack (QFP) is a package having pins or external leads that project from all four sides of the package. QFP packages are relatively cheap and also are relatively thin (i.e., have a small height) compared to other types of packages, and accordingly may be utilized where cost and height of the package are of concern. A QFP package includes a lead frame and the physical structure of the lead frame and overall QFP package makes the interconnection of multiple dies in such a package problematic.

FIG. 1 is a simplified top view of a portion of a chip including a conventional QFP package containing a lead frame 100. The lead frame 100 includes a die paddle 102 on which two die 104 and 106 are mounted, with the die 104 being a dynamic random access memory (DRAM) and the die 106 being a memory controller in the example of FIG. 1. The die paddle 102 is supported by four support arms 108 (commonly called tie bars) attached to respective corners of the die paddle. Arranged around the periphery of the die paddle 102 are a number of bond fingers 110, several of which are shown along the top, bottom, left, and right edges of the paddle. These bond fingers 110 typically extend from all four sides of the QFP package to form the external leads of the QFP and are also coupled or connected through respective bonding wires 112 to corresponding bond pads 114 on one of the dies 104 and 106. The die paddle 102, bond fingers 110, bonding wires 112, and bond pads 114 are all formed from electrically conductive material, such as a metal, as will be appreciated by those skilled in the art. To simplify FIG. 1, only the bond pads 114 in the upper left-hand corners of the dies 104 and 106 are labeled with the reference indicator 114, although all the small squares contained on each of these dies corresponds to a respective bonding pad. The illustrated bond pads 114 on each of the dies 104 and 106 merely serve to indicate that each die includes such bond pads and the number and arrangement of such bond pads may of course vary for different types of dies.

Each bond finger 110 and corresponding external lead function to route a respective electrical signal to or from the DRAM die 104 and memory controller die 106. Several example signals are shown for individual bond fingers 110 in the example of FIG. 1. For example, some of the bond fingers 110 along the right edge of the die paddle 102 route supply voltage VDD signals to the die 104. Other signals are indicated generically simply as "signal" for some of the bond fingers 110, with the signals on such bond fingers being those required for operation of die 106. In the example of FIG. 1, signals supplied to and from the memory controller die 106 via such bond fingers 110 would include address, data, and control signals.

The die paddle 102 is typically metal and is typically utilized as a ground plane, meaning that the paddle is coupled through bonding wires 112 to bond fingers 110 that receive ground GND signals, as shown for several bond fingers along the right edge of the die paddle. Any bond pads on the dies 104 and 106 that are to be coupled to ground are then simply "down bonded" to the die paddle 102, meaning such bond pads are coupled directly to the die paddle via a corresponding bonding wire 112. Several examples of down bonded ground wires are shown in FIG. 1.

The dies 104 and 106 typically include a number of bond pads 114 that receive the supply voltage signal VDD, as shown for the memory controller die 106 in FIG. 1 along the left, top, and bottom edges of the die. The interconnection of such bond pads 114 and bond fingers 110 through a corresponding bonding wire 112 is simple when the bonding pad is along the edge of the dies 104 and 106 adjacent to the bond finger. For example, routing bonding wires 112 to interconnect bond fingers 110 along the bottom edge of the die paddle 102 to corresponding bond pads 114 along the bottom edge of the memory controller die 106 is straightforward. The same is true for bond fingers 110 along the left and top edges of the die paddle 102 to bond pads 114 along the left and top edges, respectively, of the die 106.

In some situations, however, each of the dies 104 and 106 may include bond pads 114 positioned along the inner edge of the die adjacent to the other die. This is true for both the memory controller die 106 and DRAM die 104 in the example of FIG. 1. For example, the memory controller die 106 includes two bond pads 116 and 118 located along the inner edge of the die. Similarly, the DRAM die 104 includes two bond pads designated 120 and 122 located along the inner edge of this die. Typically, the bond pads 116 and 118 on the memory controller die 106 would be connected to the nearest available bond fingers 110, which are the bond fingers positioned along the left edge of the die paddle 102. Because the bond pads 116 and 118 are positioned along the inner edge of the die 106, relatively long bonding wires 124 and 126 are required to interconnect these bond pads to corresponding bond fingers 110. The same is true for the bond pads 120 and 122, which must be interconnected through respective relatively long bonding wires 128 and 132 to corresponding bond fingers 110 positioned along the right edge of the die paddle 102.

In many instances, the required length of the long bonding wires 124-130 may simply be too long to reliably form such wires. Moreover, even if such long bond wires 124-130 may be formed these wires may undesirably short circuit to other bonding wires 110 during subsequent steps of the manufacture of the QFP package, such as during encapsulation of the structure in a plastic or epoxy resin. Even before such encapsulation, such long bond wires 124-130 also may collapse due to the force of gravity, resulting in undesirable short circuits with other bonding wires 112, or to the die paddle 102 or to the edges of the die 104 and 106. Note there is no similar issue with bond pads 114 along the inner edges of the dies 104 and 106 that are to be coupled to the ground signal GND since these bond pads are simply down-bonded to the die paddle 102.

It should be noted that the bond pads 116-122 cannot be interconnected to bond fingers 110 positioned along the lower or upper edge of the die paddle 102. This is true because in this situation bonding wires 112 running substantially vertically from the vertical stack of inner bonding pads in FIG. 1 may undesirably cross and short circuit to one another or to the other bonding wires running substantially horizontally and interconnecting bond pads and bond fingers.

The structure of a QFP package requires that bonding wires 112 be used to directly interconnect the bond pads 114 and bond fingers 110. This is in contrast to other types of packages such as ball grid arrays where there is an underlying substrate on which the two die 104 and 106 are mounted. This substrate functions like a miniature circuit board and simplifies the routing of the supply voltage signals VDD to required bond pads 114 on the two die 104 and 106.

One approach to solving the problem of providing the supply voltage signal VDD to bond pads 114 along the inner edges of the dies 104 and 106 is to alter the design of dies 104 and 106 so as to reposition the location of the bond pads on each die to be directly across from bond fingers 110. Ideally, however, it is desirable that the same die 104 and 106 could be utilized whether the dies are being placed in a QFP package, a ball grid array package, or any other type of package. Repositioning the bond pads that are presently located along the inner edges of the dies 104 and 106 would make these die unsuitable for use individually in these standard packages. Moreover, this redesign of dies 104 and 106 is relatively expensive and time consuming since it involves the cost of new mask layers used in the die fabrication process and the time it takes to fabricate new die.

Another approach for providing the supply voltage signal VDD to bond pads 114 along the inner edges of the dies 104 and 106 is to relocate the pad locations using a redistribution layer ("RDL") formed as an additive process on the top of each die. As its name implies, such a redistribution layer redistributes or repositions the locations of underlying bond pads 114 on the dies 104 and 106. With this approach, the bond pads 116 and 118 along the right or inner edge of the memory controller die 106 would be repositioned along the remaining three sides of this die for easy connection to an adjacent bond finger 110 through a relatively short bonding wire 112. The same is true for the bond pads 120 and 122 along the left or inner edge of the DRAM die 104, with these pads being repositioned along the remaining three sides of this die for easy connection to adjacent bond fingers 110. This approach requires the design and actual physical formation of the redistribution layer on the dies 104 and 106. While this method of relocating the bond pads is less expensive and faster than modifying the dies themselves, it is still undesirable. The other three sides may already be fully populated with bond pads and unable to accept new pads. This solution also requires an RDL be used on both dies 104 and 106.

Yet another approach is an interposer layer positioned under dies 104 and 106. The interposer layer functions similar to the substrate previously described for a ball grid array to route a connection for bond pads 116-122 that receive the supply voltage signal VDD to adjacent bond fingers 110 to allow for easy connection to such bond fingers via short bonding wires 112. Once again, this approach is relatively expensive and therefore undesirable, and also increases the vertical height of the QFP package and thereby contravenes one major advantage of a QFP package, namely the small overall height of the QFP package. The same is true for the approach of stacking the two die 104 and 106, which may not be practical if the size of the two die are incompatible and also undesirably affects the heat dissipation and overall height of the QFP package.

There is a need in QFP or other leadframe packages that include more than one die, of interconnecting bond fingers that receive a supply voltage signal to bond pads on the dies that receive the supply voltage signal and which are positioned along inner edges of the die and thus are positioned a relatively great distance from the bond fingers.

SUMMARY OF THE INVENTION

According to one aspect of the present invention, an integrated circuit or chip includes a first die and a second die positioned on a lead frame of a package. The integrated circuit further includes a redistribution layer formed on the first die to couple selected bond fingers of the lead frame to selected bonding pads of the first and second die. The selected bond fingers may correspond to bond fingers that receive a first supply voltage, or the first supply voltage and a second supply voltage, or additional supply voltages. The package may be a QFP, DIP, PLCC, TSOP, or any other type of package including a lead frame.

DETAILED DESCRIPTION OF PREFERRED EMBODIMENTS

Figure 2:
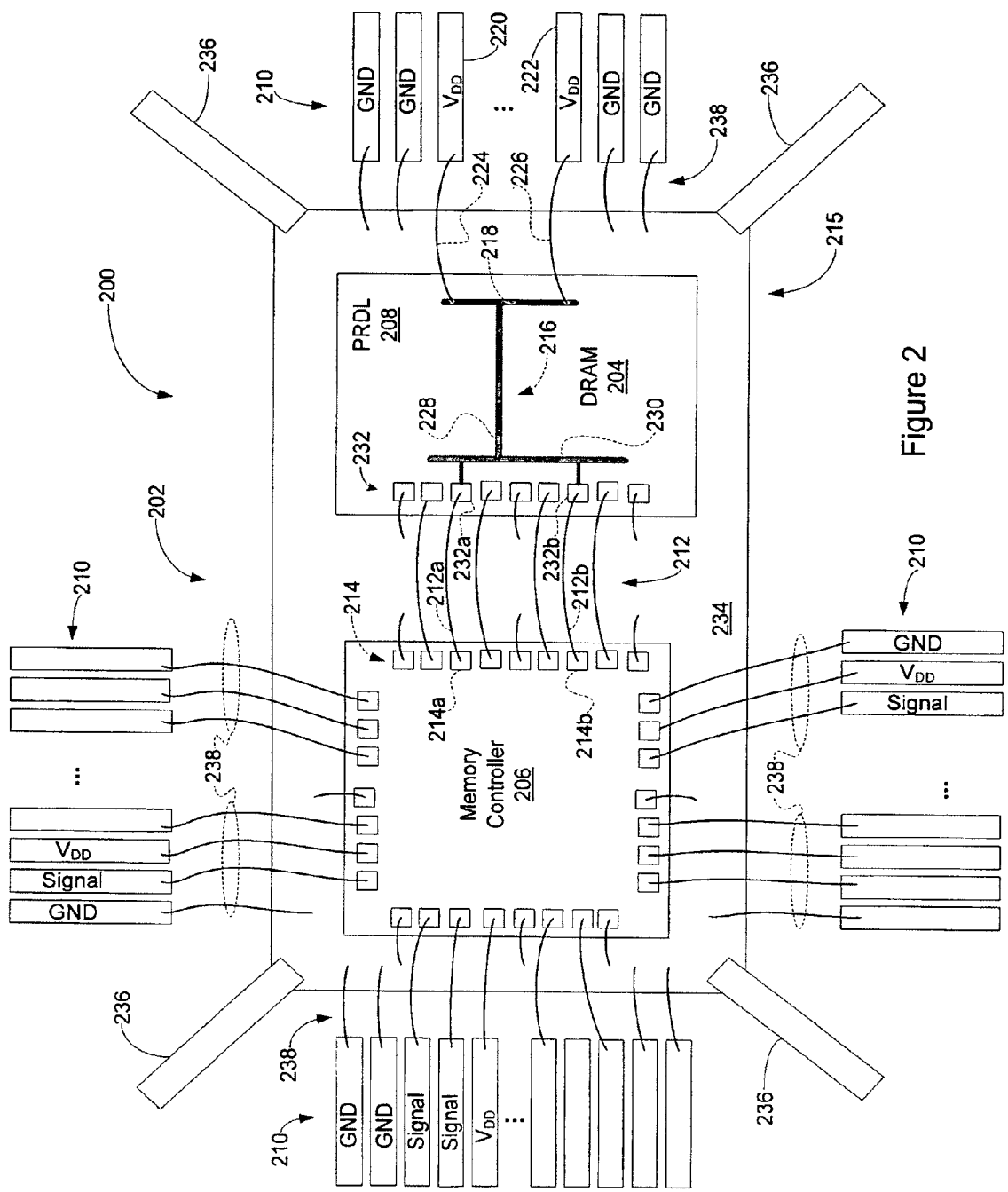
FIG. 2 is a simplified top view of a portion of a chip including a QFP package containing two die, a lead frame, and a power redistribution layer formed on one of the die for distributing power to the inner side of the dies according to one embodiment of the present invention.

FIG. 2 is a simplified top view of a portion of a chip 200 including a QFP package 202 containing a DRAM die 204 and a memory controller die 206, and having a power redistribution layer 208 formed on top of the DRAM die for distributing power to the memory controller and DRAM dies according to one embodiment of the present invention. The power redistribution layer 208 functions to transfer power in the form of a supply voltage signal VDD from bond fingers 210 positioned along the right side of the QFP package 202 towards the center of the package and thus nearer the inner sides of memory controller die 206 and DRAM die 204 that are to receive this supply voltage signal. In this way, relatively short bonding wires 212 may then be utilized to couple bonding pads 214 positioned along the right or inner edge of the memory controller die 206 to the power redistribution layer 208 to thereby receive the supply voltage signal VDD from the bond fingers 210 along the right side of the package. Additionally, the bonding pads along left or inner edge of the DRAM die 204 is also provided with the supply voltage signal VDD through the redistribution layer 208.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention. Also note that in the present description when referring generally to a plurality of the same type of component, such as bonding wires, a number descriptor will be utilized and when referring to a specific one of the plurality of components a letter designation may be appended to the number to more precisely identify a specific one of the components.

The power redistribution layer 208 includes a bus 216 having a receiving segment 218 positioned along the right edge of the DRAM die 204 and extending vertically along the die in a direction parallel to the left and right edges of the die. The receiving segment 218 receives a supply voltage signal VDD from one or more of the bond fingers 210 contained along the right side of a lead frame 215. In the example of FIG. 2, two such bond fingers 220 and 222 are illustrated and are coupled to the receiving segment 218 through respective bonding wires 224 and 226. As shown in FIG. 2, the receiving segment 218 has a length that is equal to at least the distance between bond finger 220 and bond finger 222. The bus 216 further includes a consolidator segment 228 coupled to the receiving segment 218 and extending horizontally along the DRAM die 204 in a direction parallel to the top and bottom edges of the die. The consolidator segment 228 functions to transfer the supply voltage signal VDD from the receiving segment 218 across the DRAM die 204 towards the inner edge of DRAM die 204 adjacent the memory controller die 206.

Figure 3:
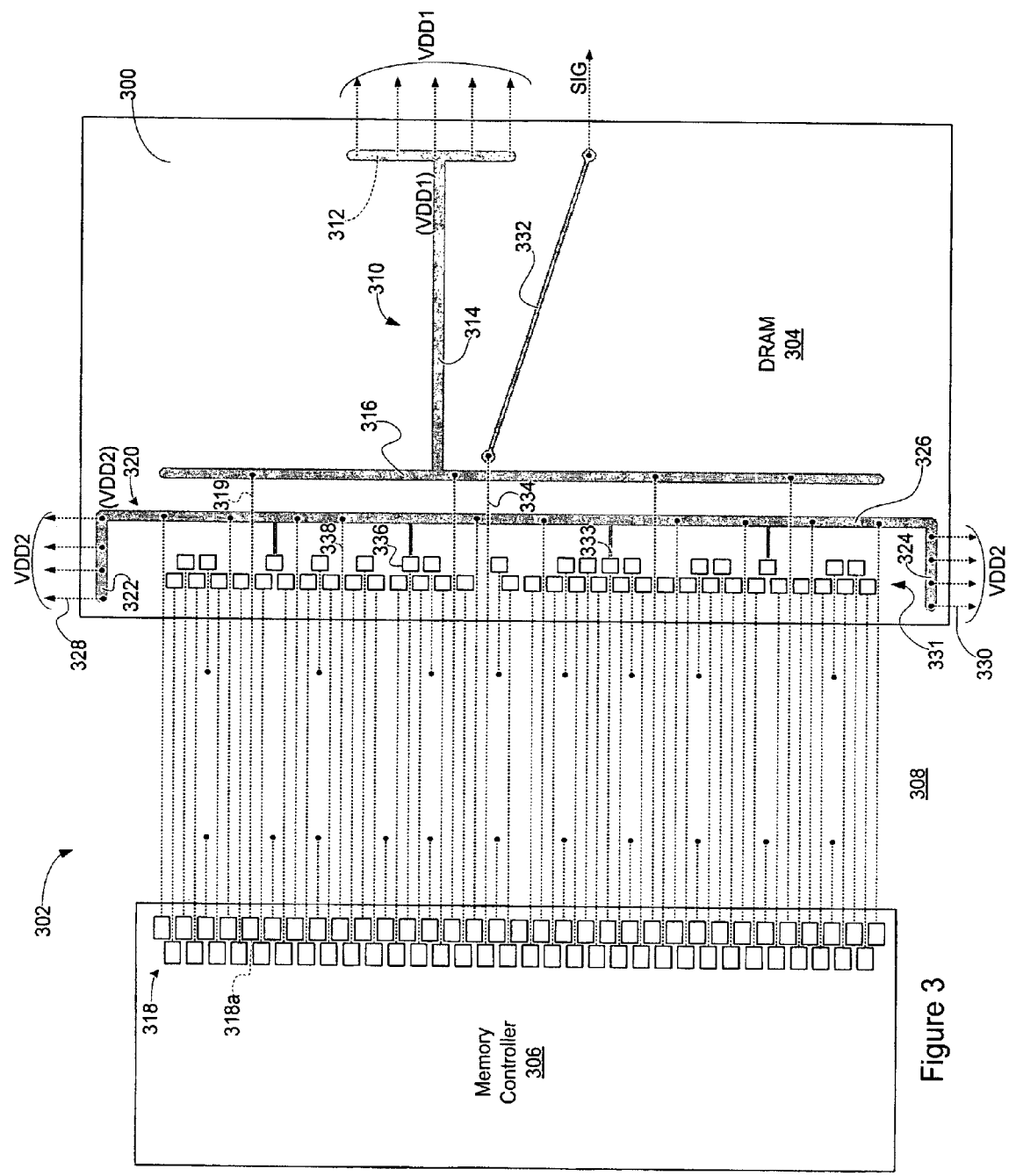
FIG. 3 is a more detailed top view of a power redistribution layer that distributes two supply voltages according to another embodiment of the present invention.

A distribution segment 230 of the bus 216 is coupled to the left end of the consolidator segment 228 and runs vertically across the DRAM die 204 from top to bottom or parallel to the left and right edges of the DRAM die. By extending vertically adjacent the inner edge of the DRAM die 204, the distribution segment 230 easily connects to the bonding pads on the DRAM die 204 that are adjacent the bond pads 214 along the inner edge of the memory controller 206. In this way, the relatively short bond wires 212 may be routed horizontally from selected bond pads 214 on the inner edge of the memory controller die 206 to selected bonding pads of the DRAM die 204 that are connected to the distribution segment 230. In the example embodiment of FIG. 2, a number of bond pads 232 are positioned along the inner edge of the DRAM die 204. The distribution segment 230 is connected to selected bond pads 232, which are designated 232a and 232b, and individual bond wires 212a and 212b extend from these bond pads to corresponding bond pads 214a and 214b along the inner edge of the memory controller die 206. As shown in FIG. 2, the distribution segment 230 has a length that is equal to at least the distance between bond pad 232a and bond pad 232b. Bond wires 212a and 212b may be directly coupled to the distribution segment 230 rather than bond pads 232a and 232b. This is illustrated in FIG. 3 and will be discussed more below with reference to that figure.

In operation, the power redistribution layer 208 routes the supply voltage signal VDD from the bond fingers 220 and 222 to the required bond pads 232a and 232b along the inner edge of DRAM die 204 and required bond pads 214a and 214b along the inner edge of the memory controller die 206. The power redistribution layer 208 enables the routing of the supply voltage signal VDD to the DRAM die 204 and the memory controller die 206 in the QFP package 202 without the need for long bond wires, relocating bond pads on the dies 204 and 206, or utilizing an interposer layer under the dies.

The power redistribution layer 208 performs a different function than a conventional redistribution layer. The power redistribution layer 208 formed on the DRAM die 204 routes signals, namely the supply voltage signal VDD, for the memory controller die 206 and not just the DRAM die 204. The DRAM die 204 in this sense functions as a substrate on which the redistribution layer 208 is formed to route required signals between bond fingers 210 on the right side of the lead frame 215 and the memory controller 206. This is in contrast to a conventional redistribution layer which, as previously discussed, is formed on a given die and redistributes or repositions the locations of underlying bond pads of that die to facilitate interconnection of such bond pads to a lead frame or other package structure.

Figure 1:
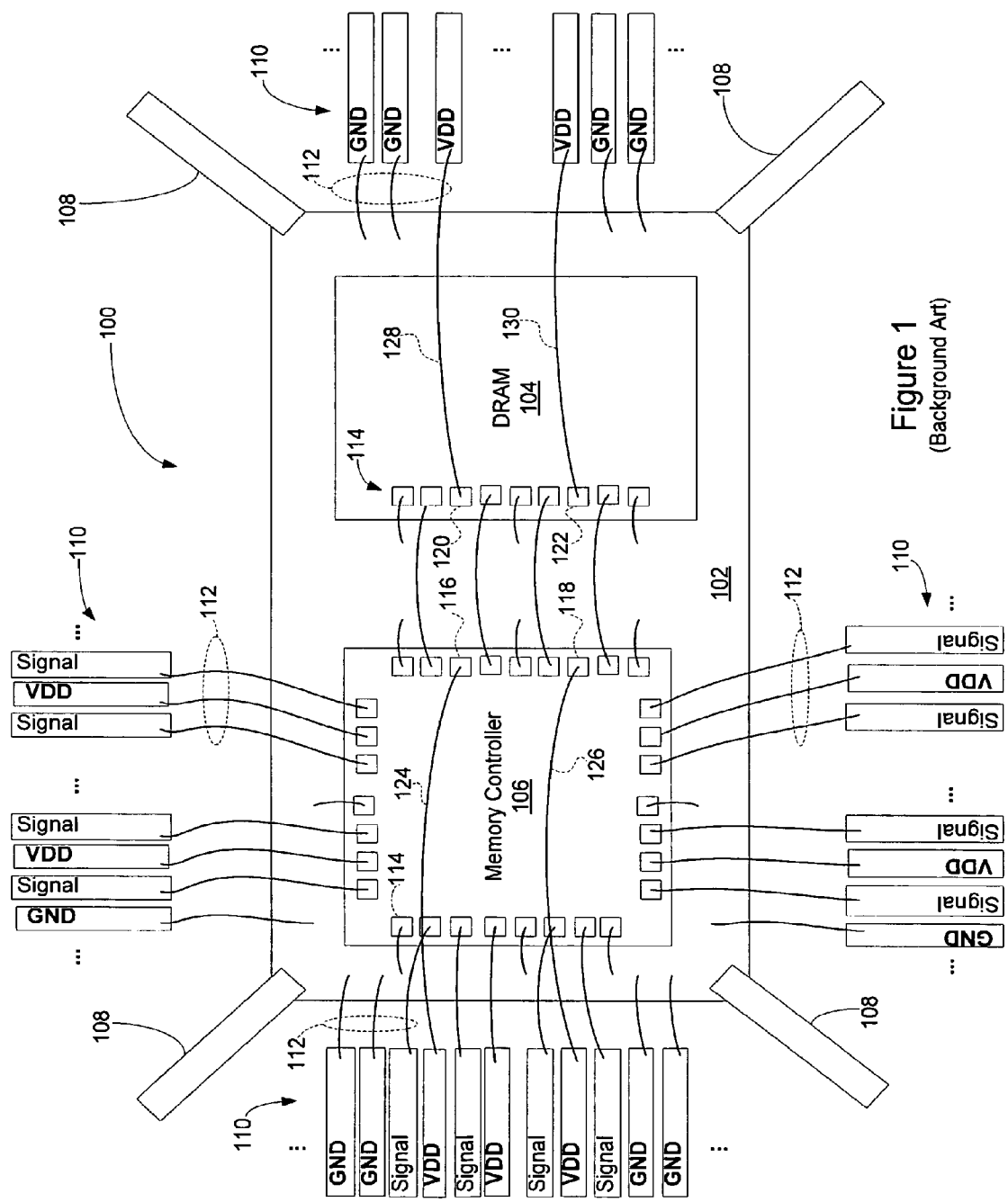
FIG. 1 is a simplified top view of a portion of a chip including a conventional QFP package containing two die and a lead frame that illustrates the prior art.

In the QFP package 202 of FIG. 2, all other bond fingers are interconnected to the dies 204 and 206 in the same way as previously discussed with reference to FIG. 1. Briefly, the lead frame 215 includes a die paddle 234 on which the two die 204 and 206 are mounted. The die paddle 234 is supported by four tie bars 236 attached to respective corners of the die paddle and arranged all around the periphery of the die paddle are a number of bond fingers 210. Several bond fingers 210 are shown along the top, bottom, left, and right edges of the die paddle 234, although in the chip 200 would typically include many more bond fingers. As previously mentioned, these bond fingers 210 are typically coupled to external leads (not shown) that extend from all four sides of the QFP package 202. The bond fingers 210 along each edge are coupled through bonding wires 238 to corresponding bond pads 214 on the memory controller die 206.

The die paddle 234 is grounded, meaning the paddle is coupled to the ground signal GND via respective bond fingers 210 and bonding wires 238. This allows bond pads 214 and 232 on the dies 204 and 206 that are to be coupled to ground to be down bonded directly to the die paddle 234 via bonding wires 238, as shown for some bond pads. The die paddle 234, bond fingers 210, all bonding wires 238, and bond pads 214 and 232, and the RDL 208 are all formed from an electrically conductive material, such as a metal. Once again, to simplify FIG. 2, the illustrated bond pads 214 and 232 on the dies 204 and 206 merely serve to show that each die includes such bond pads, and the number and arrangement of such bond pads may of course vary for different types of dies.

FIG. 3 is a more detailed top view of a power redistribution layer 300 that distributes two supply voltages, namely a first supply voltage VDD1 and a second supply voltage VDD2, according to another embodiment of the present invention. The figure illustrates a portion of a QFP package 302 including a DRAM die 304 on which the power redistribution layer 300 is formed. A memory controller die 306 is positioned adjacent the DRAM die 304 on a die paddle 308. In the embodiment of FIG. 3, the power redistribution layer 300 includes a first power bus 310 that routes the first supply voltage VDD1 from bond fingers (not shown) contained along the right edge of a lead frame of the QFP package 302. The first power bus 310 includes a receiving segment 312 to which bonding wires (not shown) are coupled to thereby couple the receiving segment to bond fingers (not shown) along the right edge of the lead frame that receive the first supply voltage VDD1.

A consolidator segment 314 of the first power bus 310 extends across the DRAM die 304 from right to left and couples to a distribution segment 316 that extends vertically along the DRAM die from top to bottom. Each of the segments 312-316 has the same function as previously described for the segment with the same name in the embodiment of FIG. 2, and thus, for the sake of brevity, these functions will not again be described in detail. The memory controller die 306 includes a number of bond pads 318 positioned along the right or inner edge of the die. Some of the bond pads 318 must receive the first supply voltage VDD1, with one such bond bad being designated 318*a* by way of example. The bond pad 318*a* is coupled to the distribution segment 316 of the first power bus 310 through a corresponding bonding wire 319, and the same is true for all other bonding pads 318 positioned along the inner edge of the memory controller die 306 that must receive the first supply voltage VDD1. The bonding wire 319 and all other bonding wires are depicted as dotted lines in FIG. 3.

In the example of FIG. 3, the memory controller die 306 must receive not only the first supply voltage VDD1, which may correspond to a core voltage for circuitry within the die, but must also receive a second supply voltage VDD2. The second supply voltage VDD2 may, for example, be an input/output (I/O) power supply for powering I/O circuitry within the die. To provide the second supply voltage VDD2 to bonding pads 318 located along the inner edge of the memory controller die 306, the power redistribution layer 300 further includes a second power bus 320. The second power bus 320 includes upper and lower receiving segments 322 and 324 positioned near the upper and lower edges, respectively, of he DRAM die 304 and interconnected through a distribution segment 326 that extends vertically between the upper and lower receiving segments along the inner edge of the DRAM die.

The upper receiving segment 322 is coupled through bonding wires to bond fingers (not shown) along the upper edge of the lead frame of the QFP package 302. One such example bonding wire 328 is shown coupled to the upper receiving segment 322 of the second power bus 320. Similarly, the lower receiving segment 324 is coupled through bonding wires to bond fingers (not shown) along the lower edge of the lead frame of the QFP package 302. A bonding wire 330 is an example of such a bonding wire coupled between the lower receiving segment 324 and a bond finger (not shown) that receives the second supply voltage VDD2.

Through this structure, the first power bus 310 routes the first supply voltage VDD1 from bond fingers (not shown) contained along the right edge of the lead frame of the QFP package 302 to bond pads 318 along the inner edge of the memory controller die 306. At the same time, the second power bus 320 routes the second supply voltage VDD2 from bond fingers (not shown) contained along the upper and lower edges of the lead frame of the QFP package 302 to bond pads 318 along the inner edge of the memory controller die 306. In this way, the power redistribution layer 300 formed on the DRAM die 304 provides all required supply voltages to bond pads 318 located along the inner edge of the memory controller die 306.

The DRAM die 304 also has bond pads 331 located on its inner edge that require coupling to the second supply voltage VDD2. These connections are made by utilizing small horizontal extensions from the distribution segment 326 to the required bond pads 331 on the DRAM die 304, such as the horizontal extension designated 333 in the figure.

The second supply voltage VDD2 is connected from the memory controller die 306 to the distribution segment 326 using bonding wires. Two methods of connecting the bond wires to the distribution segment 326 are illustrated in FIG. 3. The first method is to connect a bonding wire to a bonding pad of the DRAM die 304 that itself is connected to the distribution segment 326, such as bonding pad 336. The second method is to connect the bonding wire directly to the distribution segment 326, as illustrated with bonding wire 338 in FIG. 3.

In the embodiment of FIG. 3, the power redistribution layer 300 further includes a signal bus 332 formed just under the consolidator segment 314 of the first power bus 310. The signal bus 332 extends from the right edge of the DRAM die 304 across the die and towards the inner edge of the die and functions to route a required signal from a bond finger (not shown) on the right edge of the lead frame of the QFP package 302 to a bond pad 318 along the inner edge of the memory controller die 306. A relatively short bonding wire 334 is shown coupling a bonding pad 318 on the memory controller die 306 to the end of the signal bus 332 nearer the inner edge of the DRAM die 304. The end of the signal bus 332 near the right edge of the DRAM die 304 receives a signal SIG that is provided through a bonding wire (not shown) and a corresponding bond finger (not shown) on the right edge of the lead frame of the QFP package 302. In this way, the signal bus 332 routes the signal SIG from a bond finger (not shown) on the right edge of the lead frame of the QFP package 302 to the required bond pad 318 along the inner edge of the memory controller die 306.

Although designated as "power" redistribution layer 300, this layer is not limited to distributing only power signals but can route any type of signal that is required to be applied to bond pads 318 along the inner edge of the memory controller die 306. Moreover, in other embodiments, the power redistribution layer 300 includes additional power buses suitably formed on the DRAM die 304 for routing additional supply voltages to bond pads 318 along the inner edge of the memory controller die 306. In still other embodiment, more than one die in a QFP package includes a redistribution layer for routing signals for another one or ones of the dies in the package. The power buses 310 and 320 as well as any other power or signal buses in the redistribution layer 300 also need not include segments that run perfectly horizontally or vertically, with any or all such segments being angled as shown for signal bus 332.

Although the embodiments of FIGS. 2 and 3 are discussed with reference to QFP packages, the present invention is not limited to such packages. Other embodiments of the present invention may be applied to any type of package including a lead frame, such as the previously mentioned DIP, PLCC, TSOP, and QFP type packages. Also note that in embodiments of the invention including more than two die, multiple RDLs may be included on multiple die and a signal may be routed serially from a bonding finger through the RDLs on multiple dies to a destination die that is to receive the signal.

Figure 4:
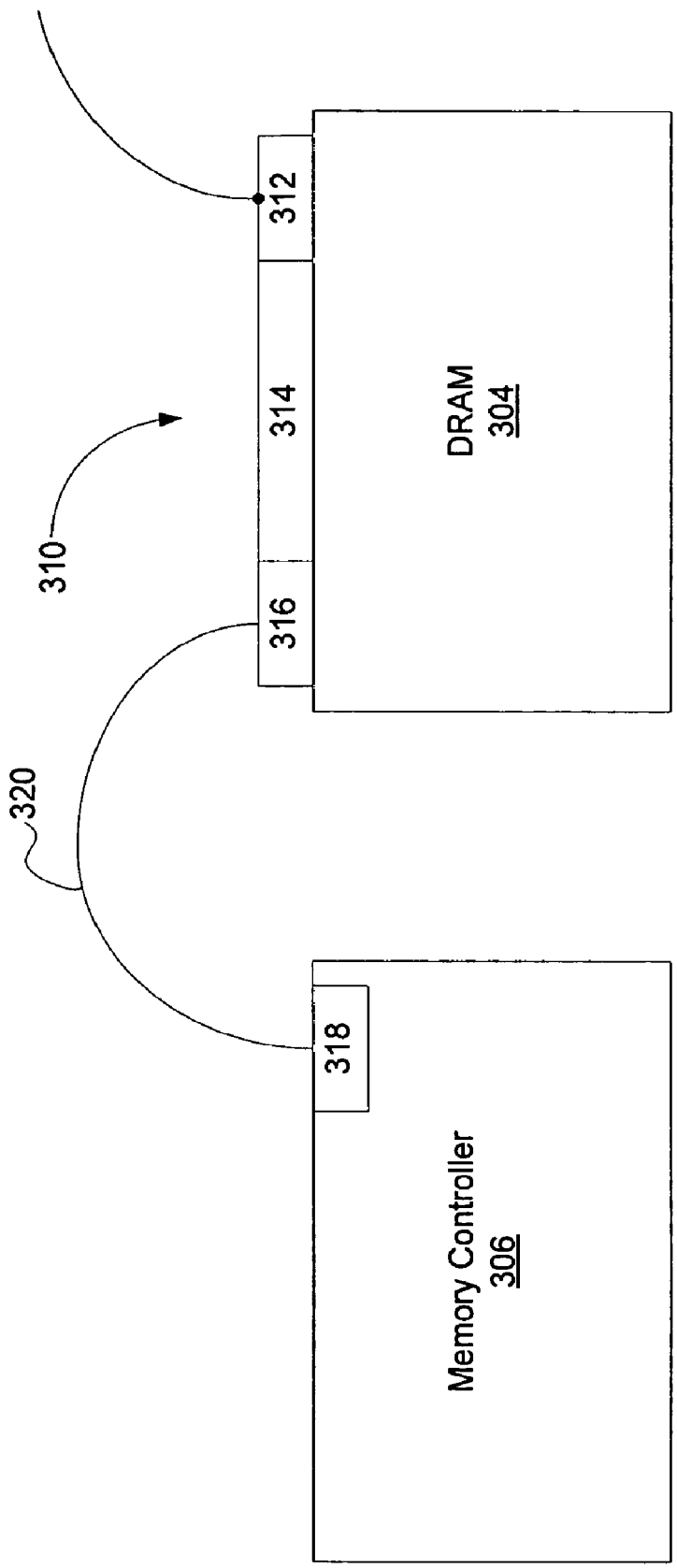
FIG. 4 is a simplified cross-sectional view illustrating the formation and function of the power redistribution layers of FIG. 2 or FIG. 3.

FIG. 4 is a simplified cross-sectional view illustrating the formation and function of the power bus 310 of FIG. 3 formed atop the DRAM die 304. The power bus 310 is formed using conventional RDL processing techniques and thus the formation of the layer will not be described in more detail. A bonding wire from a bond finger (not shown) is coupled to the receiving segment 312 that is located along the right edge of the DRAM die 304. The receiving segment 312 transfers the signal from the bond wire through the consolidator segment 314 to the distribution segment 316 positioned along the inner edge of the DRAM die 304. The bonding wire 319 couples the distribution segment 316 to a bond pad 318 located along the inner edge of the memory controller die 306.

Figure 5:
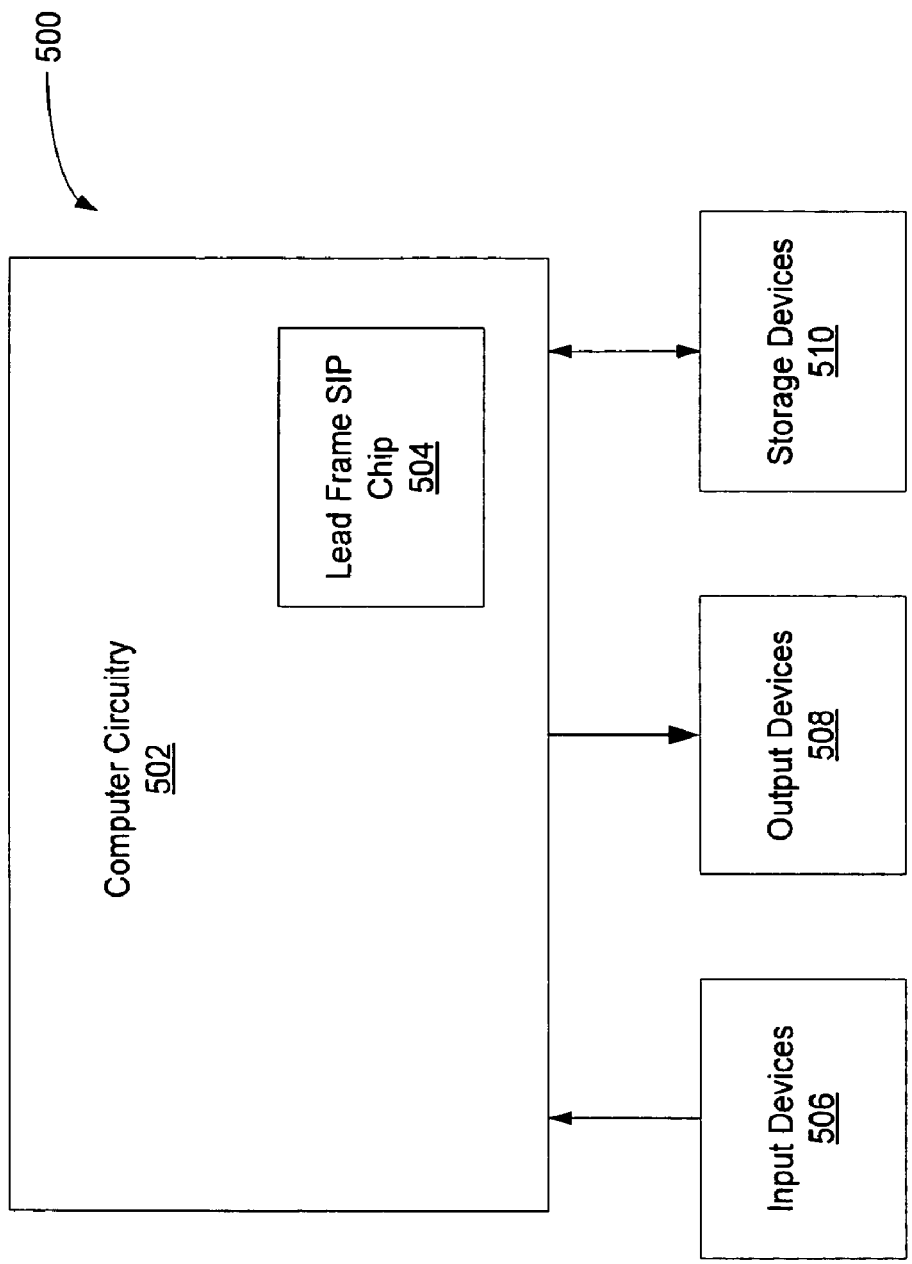
FIG. 5 is a functional block diagram of a computer system including a QFP chip containing the power redistribution layer of FIG. 2 and/or FIG. 3 according to another embodiment of the present invention.

FIG. 5 is a functional block diagram of a computer system 500 including computer circuitry 502 containing a lead frame SIP integrated circuit or chip 504 including a lead frame along with the redistribution layer 208 of FIG. 2 and/or redistribution layer 300 of FIG. 3 according to another embodiment of the present invention. Any types of dies (not shown) may be contained in the SIP chip 504, with the specific dies depending on the required function of the chip. The SIP chip 504 is not limited to including only the DRAM and memory controller dies discussed with reference to the example embodiments of FIGS. 2 and 3.

The computer circuitry 502 is coupled through suitable address, data, and control buses to the SIP chip 504 to provide for writing data to and reading data from the chip as well as for controlling the chip. The computer circuitry 502 includes circuitry for performing various computing functions, such as executing specific software to perform specific calculations or tasks. In addition, the computer system 500 includes one or more input devices 506, such as a keyboard or a mouse, coupled to the computer circuitry 502 to allow an operator to interface with the computer system. Typically, the computer system 500 also includes one or more output devices 508 coupled to the computer circuitry 502, such as output devices typically including a printer and a video terminal. One or more data storage devices 510 are also typically coupled to the computer circuitry 502 to store data or retrieve data from external storage media (not shown). Examples of typical storage devices 510 include hard and floppy disks, flash cards, compact disk read-only (CD-ROMs) and compact disk read-write (CD-RW) memories, and digital video disks (DVDs). The term computer system 500 is used broadly to include any type of electronic system in which the SIP chip 504 may be contained, and thus includes personal and server computer systems, portable electronic devices like cellular phones and personal digital assistants, and so on.

Even though various embodiments and advantages of the present invention have been set forth in the foregoing description, the above disclosure is illustrative only, and changes may be made in detail and yet remain within the broad principles of the present invention. Moreover, the functions performed by some elements may in some embodiments be combined to be performed by fewer elements, separated and performed by more elements, as will be appreciated by those skilled in the art. Therefore, the present invention is to be limited only by the appended claims.

What is claimed is:

1. A method of routing signals from bond fingers of a lead frame to a first die and a second die, the second die being positioned adjacent to the first die on the lead frame, the method comprising:

routing a first signal from a first bond finger to a first receiving segment of a first signal bus, the first receiving segment being positioned along a first outer edge of the first die in a direction parallel to the first outer edge of the first die, the first receiving segment having a length equal to at least a distance between the first bond finger and a second bond finger of the lead frame;

routing the first signal from the first receiving segment to a distribution segment of the first signal bus, the distribution segment being positioned along an inner edge of the first die in a direction parallel to the inner edge of the first die, the distribution segment having a length equal to at least a distance between a first bond pad and a third bond pad positioned along the inner edge of the first die;

routing the first signal from the distribution segment to the first bond pad to thereby provide the first signal to the first die; and routing the first signal to the second die by routing the first signal from the distribution segment to a second bond pad positioned adjacent to an inner edge of the second die, the inner edge of the second die being adjacent to the inner edge of the first die.

2. The method of claim 1, wherein the first signal comprises a first supply voltage.

3. The method of claim 2, further comprising routing a second supply voltage from a third bond finger through a node on the first die to a node on the second die.

4. The method of claim 1, wherein the first signal comprises an address, data, or control signal.

5. The method of claim 3, wherein:

the first supply voltage comprises a core voltage for circuitry within the second die; and the second supply voltage comprises input/output (I/O) power supply for powering I/O circuitry within the second die.

6. The method of claim 1, wherein routing the first signal from the first receiving segment to the distribution segment is via a consolidator segment of the first signal bus.

7. The method of claim 6, wherein the consolidator segment is elongated in a direction perpendicular to the first receiving segment.

8. The method of claim 1, wherein routing the first signal to the second die further comprises:

routing the first signal from the distribution segment to the first bond pad of the first die; and routing the first signal from the first bond pad of the first die to the second bond pad of the second die.

9. The method of claim 1, wherein the first signal bus is located on a power redistribution layer of the first die, the power redistribution layer to route a plurality of signals to the first die and the second die.

10. The method of claim 1, further comprising routing a second signal to the first die and the second die via a second signal bus.

11. The method of claim 1, wherein the first signal bus further comprises a second receiving segment positioned along a second outer edge of the first die, the second receiving segment extending in a direction parallel to the second outer edge.

12. The method of claim 11, wherein both the first and the second receiving segment are coupled to the distribution segment.

13. The method of claim 1, wherein routing the first signal from the distribution segment to the second bond pad further comprises routing the first signal from the distribution segment to the second bond pad via a bond wire.

* * * * *